United States Patent
Quaglietta et al.

(10) Patent No.: US 9,813,027 B2
(45) Date of Patent: Nov. 7, 2017

(54) DEVICES AND METHODS RELATED TO EMBEDDED SENSORS FOR DYNAMIC ERROR VECTOR MAGNITUDE CORRECTIONS

(71) Applicant: SKYWORKS SOLUTIONS, INC., Woburn, MA (US)

(72) Inventors: Anthony Francis Quaglietta, Methuen, MA (US); Mark M. Doherty, Westford, MA (US); Lui Lam, Lexington, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/583,729

(22) Filed: Dec. 28, 2014

(65) Prior Publication Data

US 2015/0303882 A1 Oct. 22, 2015

Related U.S. Application Data

(60) Provisional application No. 61/922,745, filed on Dec. 31, 2013.

(51) Int. Cl.
*H03F 1/30* (2006.01)
*H03F 3/19* (2006.01)
*H03F 3/21* (2006.01)
*H03F 1/02* (2006.01)
*H03F 3/72* (2006.01)

(52) U.S. Cl.
CPC .............. *H03F 1/30* (2013.01); *H03F 1/0261* (2013.01); *H03F 3/19* (2013.01); *H03F 3/211* (2013.01); *H03F 3/72* (2013.01); *H03F 2200/447* (2013.01); *H03F 2200/451* (2013.01); *H03F 2203/21131* (2013.01); *H03F 2203/21145* (2013.01)

(58) Field of Classification Search
USPC ............ 330/285, 296, 289, 310, 84, 286, 53
See application file for complete search history.

(56) References Cited

U.S. PATENT DOCUMENTS 7,994,862 B1 * 8/2011 Pukhovski ................ H03F 1/30
330/285
9,035,701 B2 * 5/2015 Schooley ...................... 330/289

* cited by examiner

*Primary Examiner* — Hieu Nguyen
(74) *Attorney, Agent, or Firm* — Chang & Hale LLP

(57) ABSTRACT

Devices and methods related to embedded sensors for dynamic error vector magnitude corrections. In some embodiments, a power amplifier (PA) can include a PA die and an amplification stage implemented on the PA die. The amplification stage can include an array of amplification transistors, with the array being configured to receive and amplify a radio-frequency (RF) signal. The PA can further include a sensor implemented on the PA die. The sensor can be positioned relative to the array of amplification transistors to allow sensing of an operating condition representative of at least some of the amplification transistors. The sensor can be substantially isolated from the RF signal.

18 Claims, 7 Drawing Sheets

DEVICES AND METHODS RELATED TO EMBEDDED SENSORS FOR DYNAMIC ERROR VECTOR MAGNITUDE CORRECTIONS

CROSS-REFERENCE TO RELATED APPLICATION(S)

This application claims priority to U.S. Provisional Application No. 61/922,745 filed Dec. 31, 2013, entitled DEVICES AND METHODS RELATED TO EMBEDDED SENSORS FOR DYNAMIC ERROR VECTOR MAGNITUDE CORRECTIONS, the disclosure of which is hereby expressly incorporated by reference herein in its entirety.

BACKGROUND

Field

The present disclosure relates to devices and methods for correcting dynamic error vector magnitude (DEVM) effects in radio-frequency (RF) applications.

Description of the Related Art

In some radio-frequency (RF) applications such as in wireless local area network (WLAN) power amplifier (PA) application, it is often desirable to operate a PA in a pulsed on and off mode to reduce current consumption. Such an operation can result in thermo-electric effects that can degrade dynamic error vector magnitude (DEVM) performance.

SUMMARY

According to a number of implementations, the present disclosure relates to a power amplifier (PA) that includes a PA die and an amplification stage implemented on the PA die, with the amplification stage including an array of amplification transistors. The array is configured to receive and amplify a radio-frequency (RF) signal. The PA further includes a sensor implemented on the PA die. The sensor is positioned relative to the array of amplification transistors to allow sensing of an operating condition representative of at least some of the amplification transistors. The sensor is substantially isolated from the RF signal.

In some embodiments, the sensor can include a sensing transistor configured to be similar to at least some of the amplification transistors. The operating condition can include an operating temperature of the at least some of the amplification transistors. The operating temperature can be obtained from a collector current associated with the sensing transistor.

In some embodiments, the PA can further include a bias circuit in communication with the amplification stage and the sensing transistor. The bias circuit can be configured to provide bias signals to the amplification transistors and the sensing transistor. The bias signals can include base bias voltages provided to bases of the amplification transistors and the sensing transistor. The base bias voltages can have a common value.

In some embodiments, the array of amplification transistors can include a plurality of amplification transistors arranged in a parallel configuration. The plurality of amplification transistors can be grouped into a first group and a second group. The sensor can be implemented between the first group of amplification transistors and the second group of amplification transistors.

In some embodiments, the amplification stage can include a plurality of arrays of amplifications transistors. In some embodiments, the amplification stage can include a power stage. In some embodiments, the sensor can include a bandgap reference device. In some embodiments, the sensor can include a proportional to absolute temperature (PTAT) device.

In a number of teachings, the present disclosure relates to a method for fabricating a power amplifier (PA). The method includes providing or forming a semiconductor wafer, and forming a plurality of amplification stages on the semiconductor wafer, with each amplification stage including an array of amplification transistors configured to receive and amplify a radio-frequency (RF) signal. The method further includes forming a plurality of sensors on the semiconductor wafer such that at least one sensor is positioned relative to each array of amplification transistors to allow sensing of an operating condition representative of the amplification transistors, with the sensor being substantially isolated from the RF signal.

In some embodiments, the method can further include singulating the semiconductor wafer to yield a plurality of PA die.

In some implementations, the present disclosure relates to a radio-frequency (RF) module that includes a packaging substrate configured to receive a plurality of components, and a power amplifier (PA) die mounted on the packaging substrate. The PA die includes a PA circuit with an amplification stage including an array of amplification transistors configured to receive and amplify a radio-frequency (RF) signal. The PA die further includes a sensor positioned relative to the array of amplification transistors to allow sensing of an operating condition representative of at least some of the amplification transistors, with the sensor being substantially isolated from the RF signal.

In some embodiments, the PA circuit can be configured to amplify an RF signal for a wireless local area network (WLAN). In some embodiments, the sensor can be configured to track an operating temperature of the amplification stage.

In some embodiments, the RF module can further include a bias circuit in communication with the amplification stage. The bias circuit can be configured to provide bias signals to the amplification transistors. The bias circuit can be further configured to compensate at least some of the bias signals based on a sensed signal representative of the operating temperature. The compensation of the bias signals can be configured to compensate for a dynamic error vector magnitude (DEVM) effect associated with the PA circuit.

In some embodiments, at least a portion of the bias circuit can be implemented on the PA die.

In a number of teachings, the present disclosure relates to a wireless device that includes a transmitter circuit configured to generate a radio-frequency (RF) signal, and a power amplifier (PA) circuit in communication with the transmitter. The PA circuit is configured to amplify the RF signal, and includes an amplification stage having an array of amplification transistors configured to receive and amplify the RF signal. The PA circuit further includes a sensor positioned relative to the array of amplification transistors to allow sensing of an operating condition representative of at least some of the amplification transistors, with the sensor being substantially isolated from the RF signal. The wireless device further includes an antenna in communication with the PA circuit. The antenna is configured to transmit the amplified RF signal.

In some embodiments, the antenna can be a wireless local area network (WLAN) antenna.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
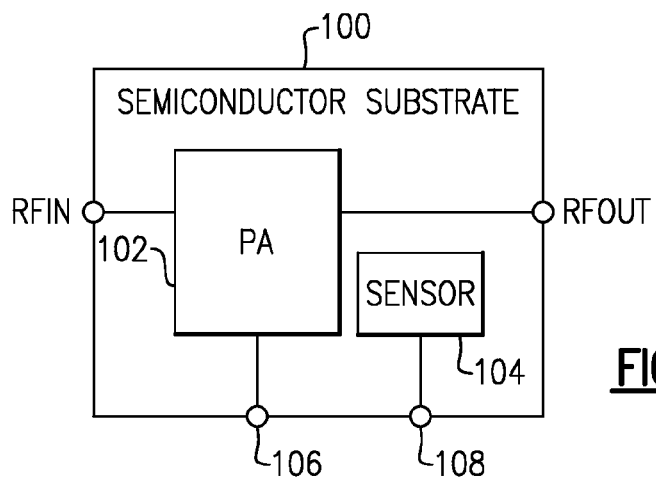
FIG. 1 shows a semiconductor die having an embedded sensor having one or more features as described herein.

FIG. 1 shows a semiconductor substrate 100 such as a semiconductor die having a power amplifier (PA) circuit 102. Such a PA circuit can be configured to receive a radio-frequency (RF) signal through an input (RFin) and generate an amplified RF signal through an output (RFout). Operation of the PA circuit 102 can be facilitated by bias and supply signals collectively depicted as being provided through a port 106.

FIG. 1 shows that the semiconductor die 100 can include an embedded sensor 104 implemented thereon. In some embodiments, the sensor can be operated by signals collectively depicted as being provided through a port 108. Examples of such a sensor are described herein in greater detail. As also described herein, such a sensor can be utilized to compensate for dynamic error vector magnitude (DEVM) effects associated with the operation of the PA circuit 102. In some embodiments, such a sensor can be configured to track an operating condition such as operating temperature of the PA circuit, and implement a DEVM compensation based on such tracked temperature.

DEVM compensation achieved in the foregoing manner can provide a number of advantageous features. For example, DEVM compensation can be achieved independent of, for example, supply power, duty cycle (Toff), temperature, and/or layout, at least to the first order. In some embodiments, sensors as described herein can be configured to be generally isolated from RF signals. Accordingly, DEVM compensation can be achieved without affecting normal gain expansion characteristics at high RF power.

Figure 2:
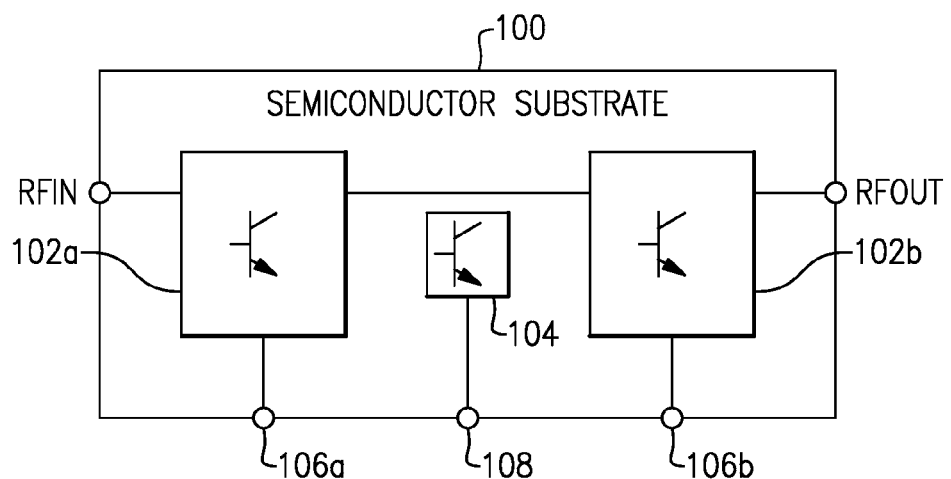
FIG. 2 shows an example where the sensor of FIG. 1 can be an embedded sensing transistor between two amplification stages.

FIG. 2 shows an example where the sensor 104 of FIG. 1 can be an embedded sensing transistor. The sensing transistor 104 can be similar to one or more amplifying transistors 102a, 102b that are implemented along an RF path (e.g., between RFin and RFout). The sensing transistor 104 can be operated similar to the amplifying transistors 102a, 102b; however, the sensing transistor 104 can be substantially isolated from the RF path. Accordingly, the sensing transistor 104 can be utilized to sense one or more operating conditions associated with the amplifying transistors 102a, 102b, without being affected by RF power.

In the example of FIG. 2, the amplifying transistors 102a, 102b are collectively depicted as being operated by signals provided through respective ports 106a, 106b. The sensing transistor 104 is collectively depicted as being operated by signals provided through a port 108.

Figure 3:
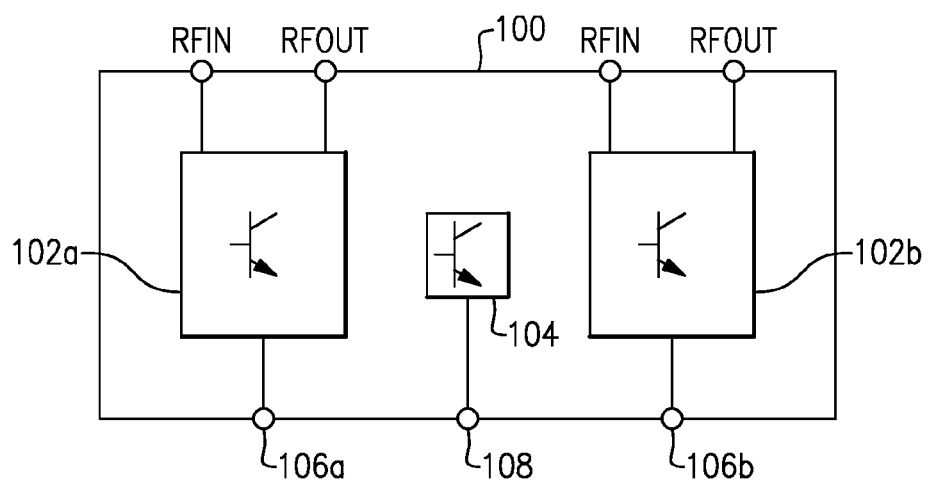
FIG. 3 shows an example where the sensor of FIG. 1 can be an embedded sensing transistor between two amplification circuits configured to operate independently or in a parallel manner.

In the example of FIG. 2, the amplifying transistors 102a, 102b are depicted as being arranged in stages between the input (RFin) and the output (RFout). It will be understood that amplifying transistors can also be arranged and utilized in other manners. For example, FIG. 3 shows a configuration where a first group of one or more transistors 102a can receive, amplify, and output an RF signal. Similarly, a second group of one or more transistors 102b can receive, amplify, and output an RF signal. In some embodiments, the first group 102a and the second group 102b can amplify RF signals independently from each other. In some embodiments, the first group 102a and the second group 102b can be arranged in a parallel manner and collectively amplify an RF signal.

Figure 4:
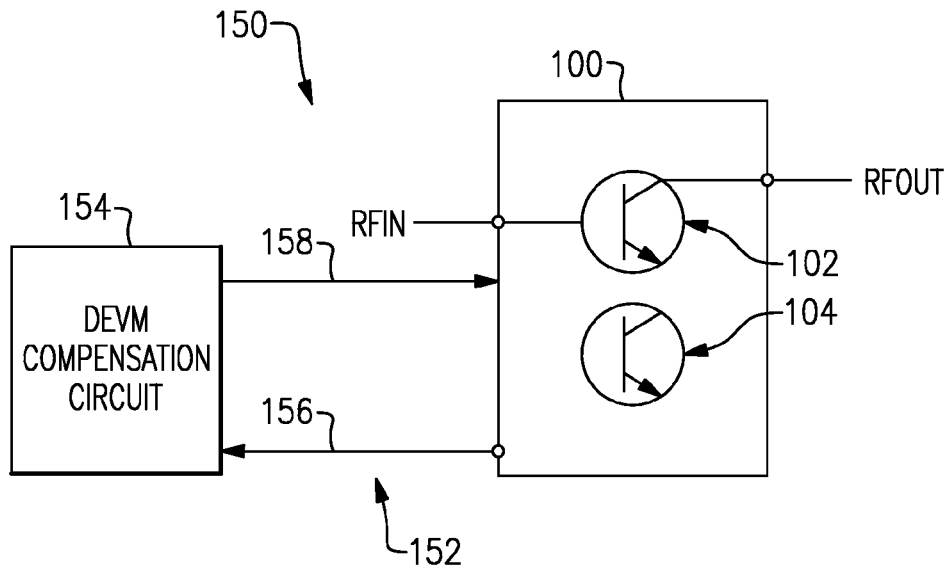
FIG. 4 shows an example configuration where the embedded sensing transistor configuration of FIGS. 2 and 3 can be implemented in a dynamic error vector magnitude (DEVM) compensation application.

FIG. 4 shows an example configuration where the embedded sensing transistor configuration of FIGS. 2 and 3 can be implemented in a DEVM compensation application. In an example configuration 150, a group of one or more amplifying transistors 102 is shown to be implemented on a die 100, so as to allow amplification of an input RF signal (RFin). The amplified RF signal is depicted as being output as RFout. The same die 100 is shown to further include a sensing transistor 104 that is not coupled with the RF signal.

FIG. 4 shows that in some embodiments, the configuration 150 can include a DEVM compensation control loop 152 that includes the sensing transistor 104 in communication with a DEVM compensation circuit 154. An operating parameter that is generally common to the sensing transistor 104 and the amplifying transistors 102 can be sensed by the sensing transistor 104 and passed onto the DEVM compensation circuit 154 (e.g., through path 156). The DEVM compensation circuit 154 can generate one or more control signals based on such a sensed signal; and the control signal(s) can be provided to either or both of the amplifying transistors 102 and the sensing transistor 104 (e.g., through path 158). In configurations where the sensing transistor 104 is operated generally identical or similar to the amplifying transistors 102 (except the absence of RF signals), the control signals from the DEVM compensation circuit 154 can be provided to both of the amplifying transistors 102 and the sensing transistor 104.

In the example shown in FIG. 4, the DEVM compensation loop can be configured as a closed feedback loop. In other embodiments, other types of compensation control can be implemented. In some embodiments, some or all of the DEVM control circuit 154 may or may not be implemented on the same die 100 on which the amplifying transistors 102 and the sensing transistor 103 are implemented.

Figure 5:
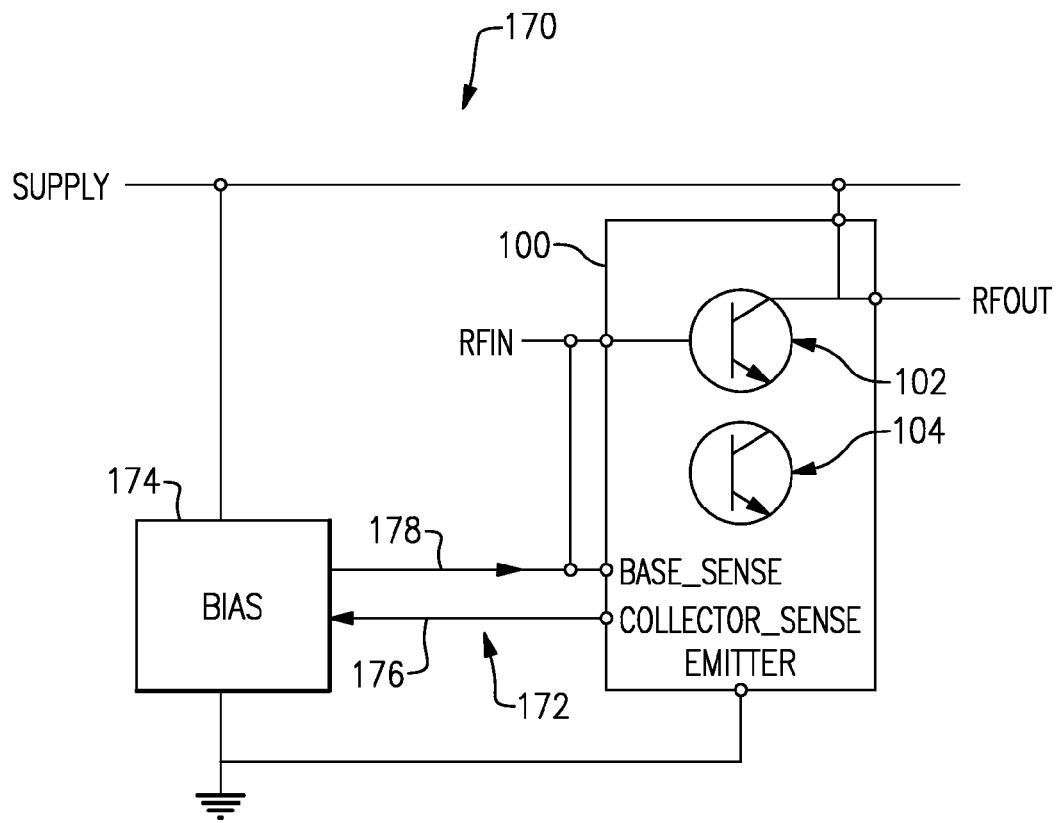
FIG. 5 shows that in some embodiments, some or all of the DEVM compensation circuit of FIG. 4 can be implemented in a bias circuit.

FIG. 5 shows that in some embodiments, some or all of the DEVM compensation circuit 154 of FIG. 4 can be implemented in a bias circuit 174. In an example configuration 170, the bias circuit 174 is depicted as providing (e.g., through path 178) a bias voltage to the bases of the amplifying transistors 102. The same bias voltage can be provided to the base of the sensing transistor 104 through a node indicated as Base_sense. In some embodiments, the Base_sense node can be coupled to the base of the sensing transistor 104 in such a manner so as to substantially isolate the sensing transistor 104 from the input RF signal (RFin).

In some embodiments, the base bias voltage provided to the amplifying transistors 102 and the sensing transistor 104 can be adjusted based on a collector current associated with the sensing transistor 104. Such a collector current of the sensing transistor 104 can be sensed by the bias circuit 174 through path 176. Accordingly, a feedback control loop 172 can be implemented, where a sensed collector current of the sensing transistor 104 is utilized to adjust a base bias voltage to compensate for DEVM effects associated with the amplifying transistors 102.

Figure 6:
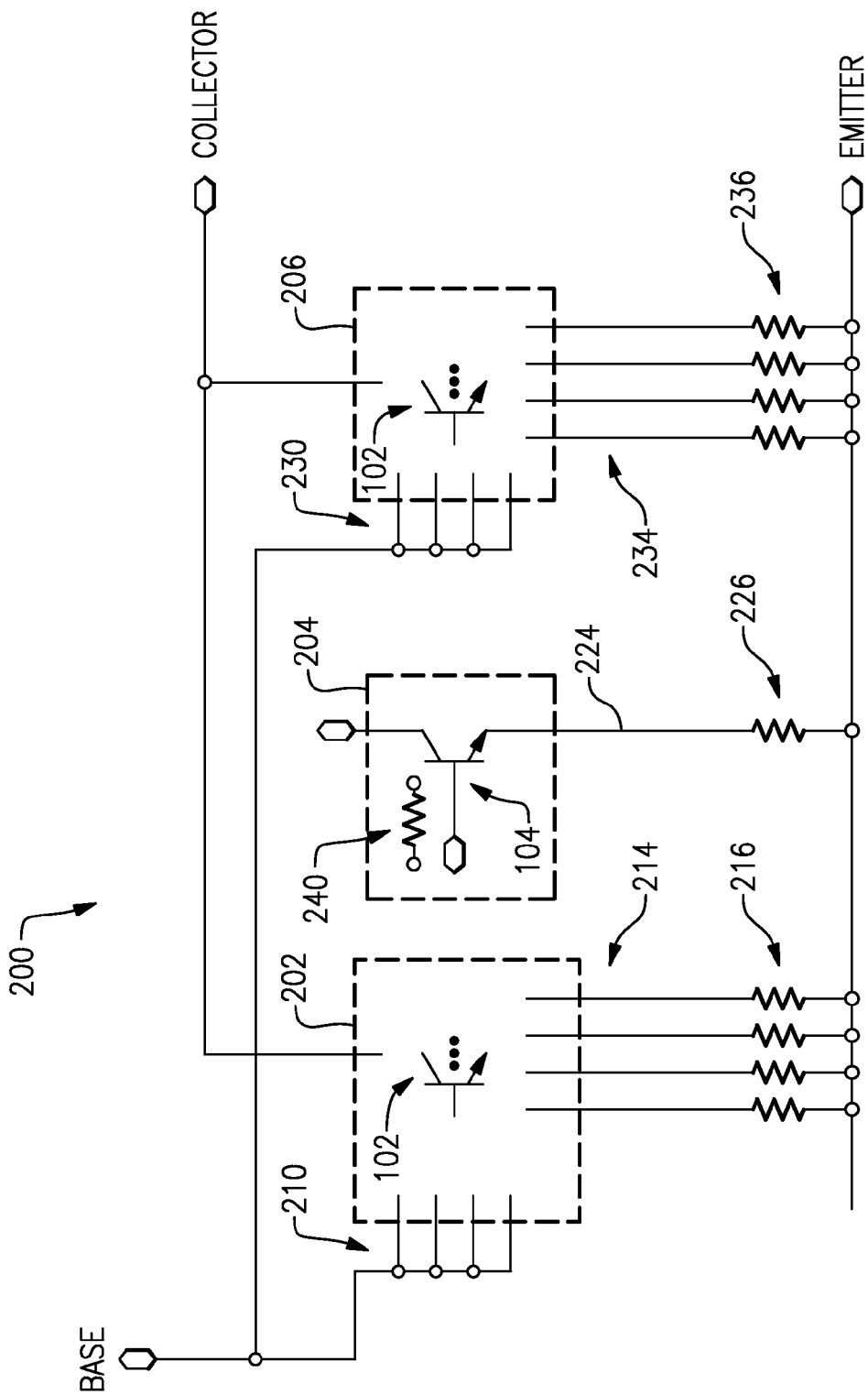
FIG. 6 shows an example power amplifier (PA) configuration in which an embedded sensing transistor having one or more features as described herein can be implemented.

FIG. 6 shows an example PA configuration 200 in which an embedded sensing transistor 104 can be implemented. The PA configuration 200 can be a portion of a power stage of an RF amplifier. In the example shown, eight amplifying transistor devices 102 are shown to be connected in a parallel configuration and arranged in two groups 202, 206, with the first group 202 having four transistor devices 102 and the second group 206 having another four transistor devices 102. In some embodiments, at least one of the groups (202, 206) can include one or more spare transistor devices.

Although described in the context of eight amplifying transistors in a four plus four arrangement, it will be understood that other numbers of amplifying transistors can be implemented. Further, such amplifying transistors can be grouped into more or less groups than the example of two, and there may or may not be the same number of amplifying transistors in such groups.

In the example of FIG. 6, a sensing transistor 104 is shown to be implemented between the first group 202 and the second group 206. Physical location of the sensing transistor 104 in such an arrangement can allow the sensing transistor 104 to measure an operating condition (e.g., temperature) that is generally representative of the amplifying transistors 102.

In the example of FIG. 6, base bias signals for the eight amplifying transistors 102 are shown to be provided through connections 210 for the first group 202 and connections 230 for the second group 206. Such connections 210, 230 can receive a common base bias signal through the Base node.

In the example of FIG. 6, emitter ballasting for the eight amplifying transistors 102 and the sensing transistor 104 can be provided through connections 214 (for the first group 202), connections 234 (for the second group 206), and connection 224 (for the sensing transistor 104). Emitter ballast resistors 216 (for the first group 202), 236 (for the second group 206), and 226 (for the sensing transistor 104) can couple their respective connections to the Emitter node. In some embodiments, the emitter ballast resistors for the eight amplifying transistors 102 can have a substantially same value. The emitter ballast resistor for the sensing transistor 104 may or may not have the same value as that for the amplifying transistors 102. In some embodiments, base-ballasting can also be implemented in a similar manner.

In the example of FIG. 6, collector signals for the eight amplifying transistors 102 are shown to be provided from the common Collector node.

In some embodiments, the base of the sensing transistor 104 can be coupled to the Base node so as to receive the same base signal as that provided to the amplifying transistors 102. The collector of the sensing transistor 104 can be coupled to a bias circuit (not shown in FIG. 6) so as to allow the bias circuit to monitor, for example, collector current associated with the sensing transistor 104 and generate an appropriate DEVM compensating signal for the amplifying transistors 102. In some embodiments, an embedded resistor 240 can be implemented to, for example, allow tracking of base resistance. Such a sensed resistance can be used independently, or with the sensed collector current, to generate DEVM compensating signals.

In the foregoing example of FIG. 6, the addition of the sensing transistor 104 can increase the length of the unit 200 of amplifying transistors 102. For example, for a 1 KOhm substrate, the length of the unit 200 can increase by about 30 µm or 50 µm, due to collector spacing. For a 50 Ohm substrate, the increase in the length of the unit 200 can be smaller.

Figure 7:
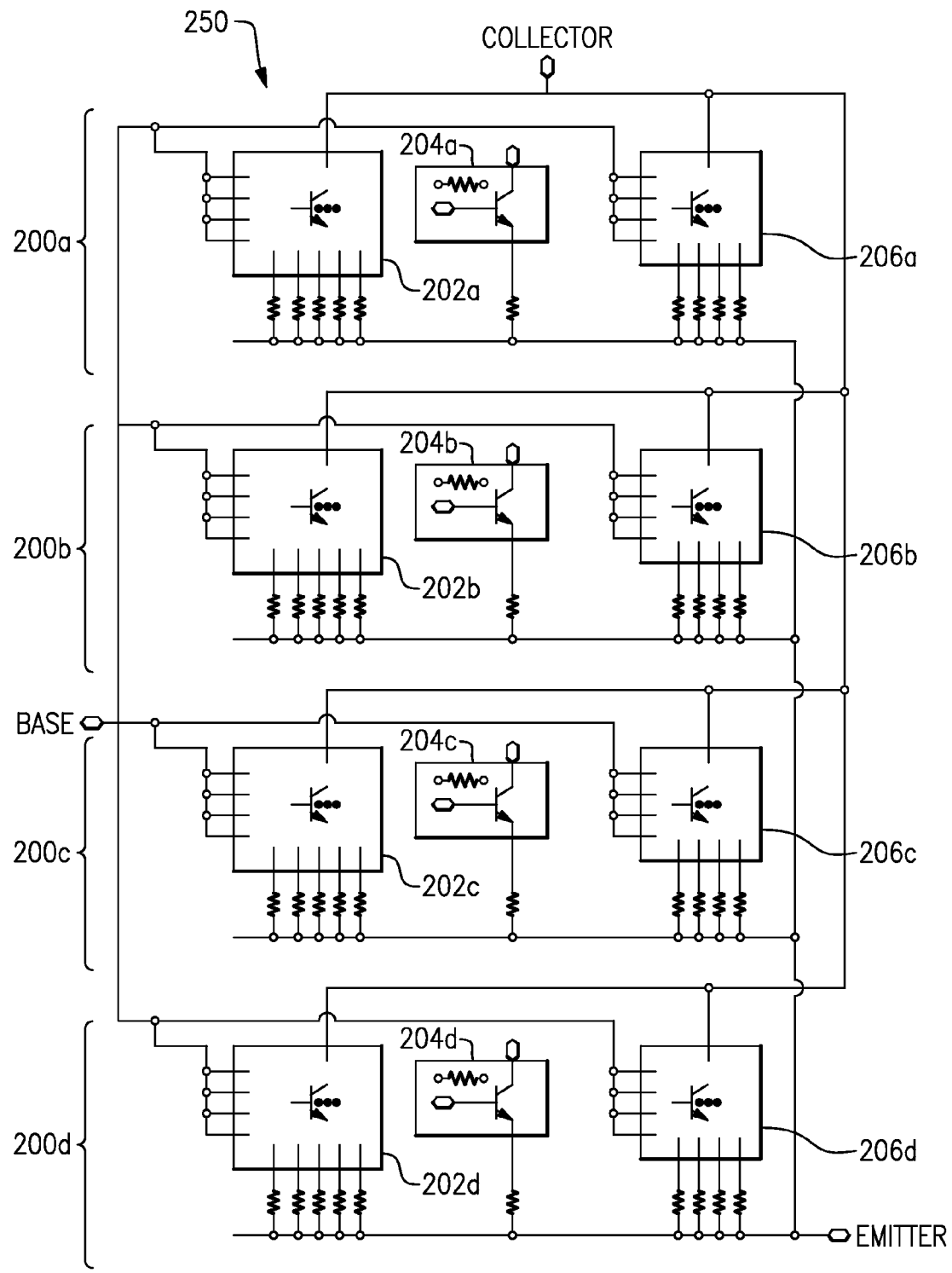
FIG. 7 shows an example of a power stage having four units arranged in a parallel configuration, in which unit can be similar to the example of FIG. 6.

In some embodiments, a plurality of units (such as the example unit 200 of FIG. 6) can be arranged to form a power stage of a PA. FIG. 7 shows an example of a power stage 250 having four units (200a, 200b, 200c, 200d) arranged in a parallel configuration. Each of the four units (200a, 200b, 200c, 200d) can be similar to the example described in reference to FIG. 6. It will be understood that a power stage can include more or less number of units.

In the context of the four-unit example of FIG. 7, each of the eight amplifying transistors (102 in FIG. 6) can occupy, for example, about 48 µm$^2$. Accordingly, the eight amplifying transistors associated with each unit (200 in FIG. 6) can occupy about 8×48 µm$^2$=384 µm$^2$, and the amplifying transistors associated with the power stage 250 can occupy about 4×384 µm$^2$=1,536 µm$^2$. The addition of one or more sensing transistors in each unit can increase the overall area proportionally to the length-increase described herein.

In the example of FIG. 7, each of the four units (200a, 200b, 200c, 200d) is depicted as including a sensing transistor. In some embodiments, not all of the units need to have their respective sensing transistors. For example, one sensing transistor in a selected unit can provide sensing functionality for the entire power stage. If the power stage is sufficiently large where it may be desirable to include more than one sensing locations, more than one sensing transistors can be implemented at selected locations, and sensed information from such sensing transistors can be utilized separately, together, or some combination thereof.

In some embodiments, design factors such as number of transistors in a unit, transistor sizes, and number of units can be selected based on, for example, level of power being handled by a power stage (e.g., amount of linear power required or desired). Typically, it is desirable to have larger array sizes for higher-power configurations. It will be understood that although various examples are described herein in the context of a power stage, one or more features of the present disclosure can also be implemented in other PA stages. Further, although described in the context of PA applications, one or more features of the present disclosure can also be implemented in other applications involving arrays of transistors where sensing of operating condition is desirable.

In some embodiments, the sensor 104 of FIG. 1 can include one or more transistors as described herein. The sensor 104 can also include devices such as a bandgap reference device, a proportional-to-absolute-temperature (PTAT) reference device, or some combination thereof. Such devices can be based on, utilized in conjunction with, or utilized independent from the sensing transistors as described herein, depending on a desired temperature compensation.

Figure 8:
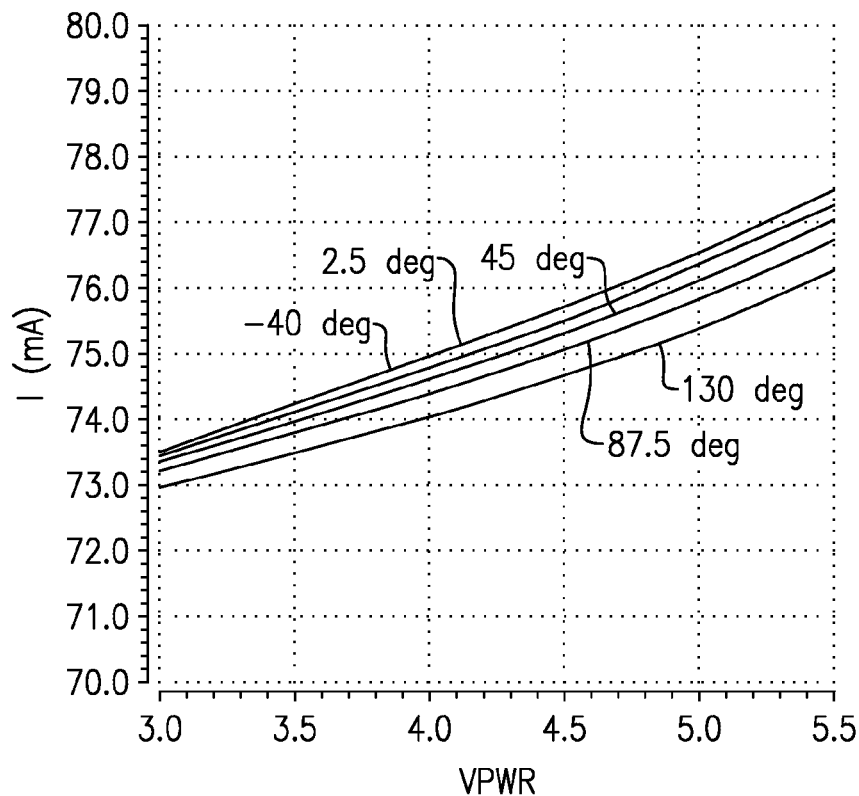
FIG. 8 shows example quiescent current curves as a function of supply voltage at different operating temperatures of a power stage without the benefit of a sensing transistor.
Figure 9:
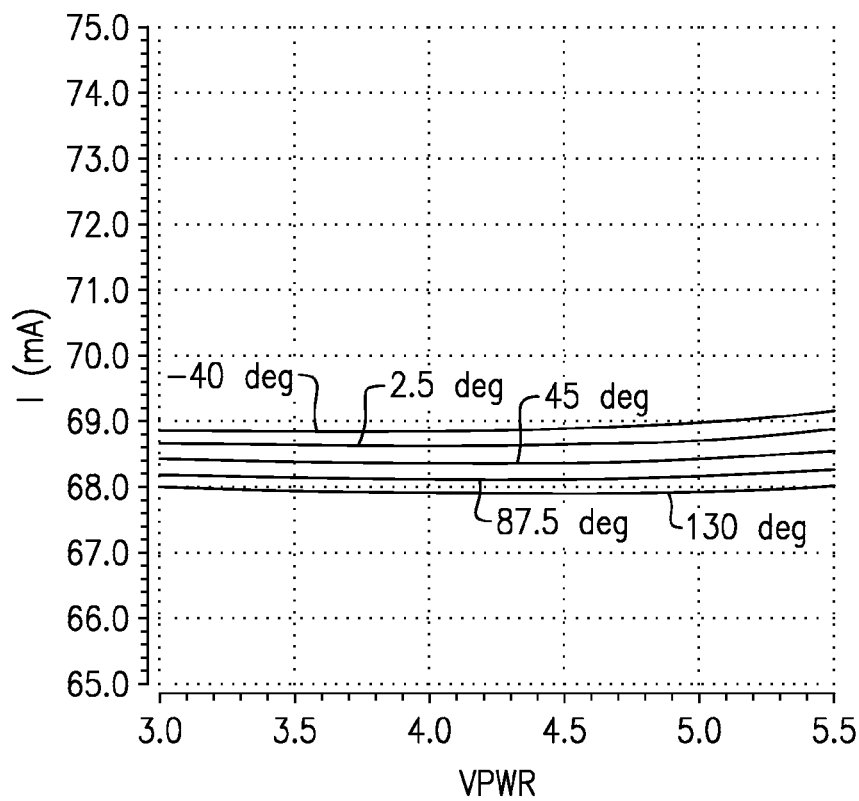
FIG. 9 shows example quiescent current curves as a function of supply voltage at different operating temperatures of a power stage with the benefit of a sensing transistor having one or more features as described herein.

FIGS. 8-11 show examples of performance improvements that can be obtained by utilizing a sensing transistor having one or more features as described herein. FIG. 8 shows quiescent current curves as a function of supply voltage at different operating temperatures of a power stage without the benefit of a sensing transistor. FIG. 9 shows quiescent current curves of a power stage with the benefit of a sensing transistor (e.g., configuration 250 of FIG. 7). One can readily see that the quiescent current values are generally lower with the sensing transistor. Further, the lowered quiescent currents in FIG. 9 are generally independent of the shown range of supply voltage.

Figure 10:
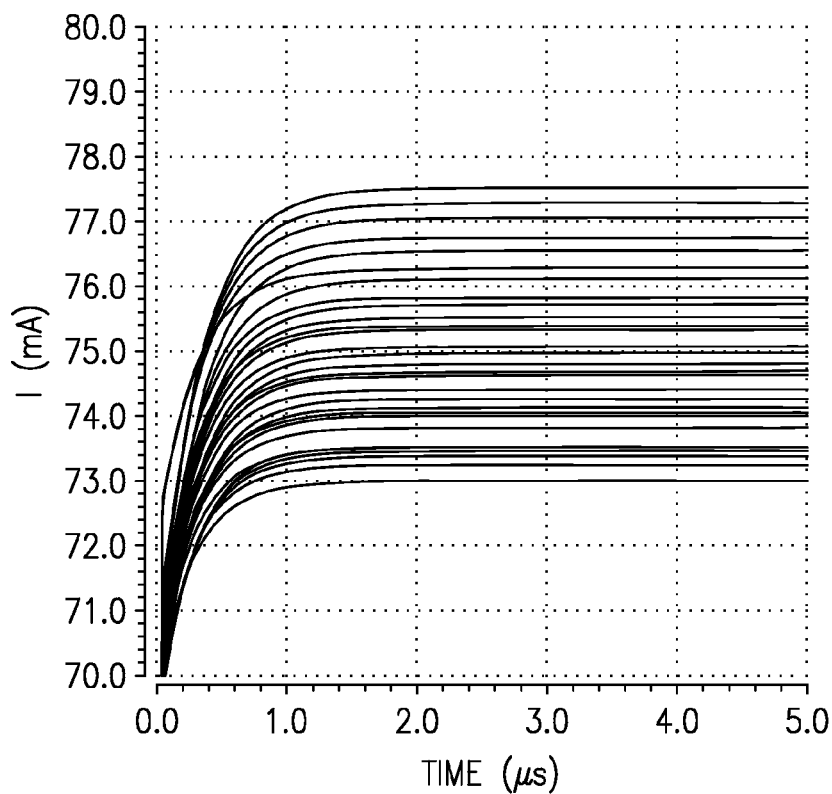
FIG. 10 shows example collector current profiles when amplifying transistors of a power stage are turned on at different temperatures, without the benefit of a sensing transistor.
Figure 11:
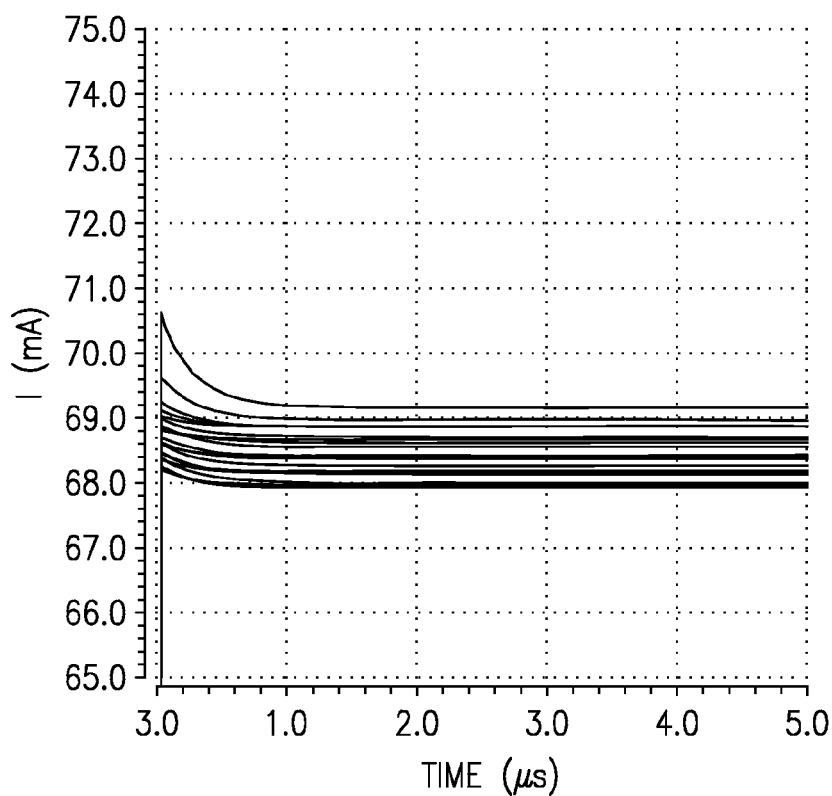
FIG. 11 shows example collector current profiles when amplifying transistors of a power stage are turned on at different temperatures, with the benefit of a sensing transistor having one or more features as described herein.

FIG. 10 shows collector current profiles when the amplifying transistors of a power stage are turned on at different temperatures, without the benefit of a sensing transistor. FIG. 11 shows collector current profiles when the amplifying transistors of a power stage are turned on at different temperatures, with the benefit of a sensing transistor. One can readily see that steady state is reached much faster for the power stage with the benefit of the sensing transistor.

Figure 12:
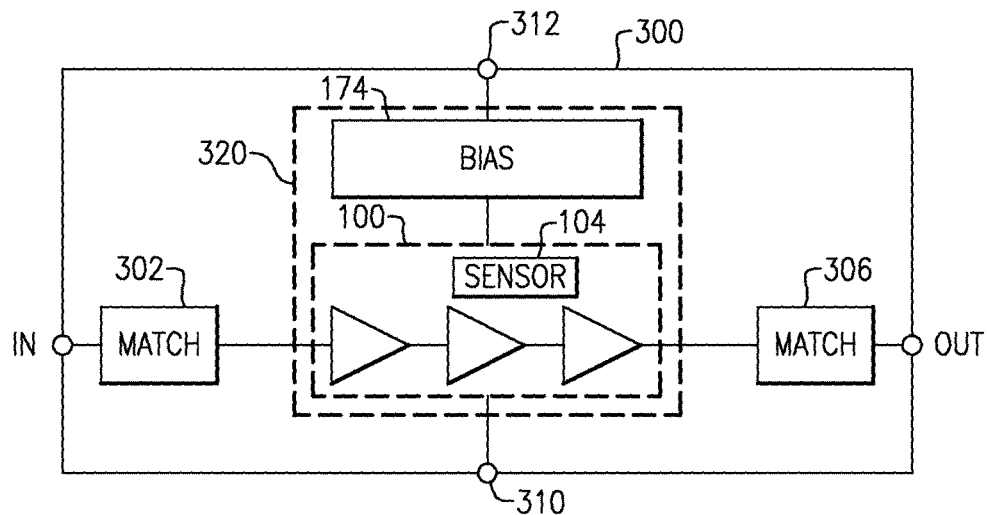
FIG. 12 shows that in some embodiments, a PA die having one or more features as described herein can be implemented in a radio-frequency (RF) module.

FIG. 12 shows that in some embodiments, a PA die 100 having one or more features as described herein can be implemented in an RF module 300. As described herein, such a PA die can include one or more stages, and one or more sensing devices 104 such as a sensing transistor can be implemented in one of such stages (e.g., a power stage), between stages, or any combination thereof.

The PA circuit can be configured to receive an RF signal through an input node (IN) and an input matching network 302. The amplified RF signal can be passed through an output matching network 306 and output through the OUT node. Operation of the PA circuit can be facilitated by, for example, supply power collectively depicted by a node 310.

The PA circuit implemented on the die 100 can be biased by a bias circuit 174. In some embodiments, such a bias circuit can be coupled to the sensor and be configured to provide a feedback in response to a sensed signal obtained from the sensor 104. In some embodiments, such a feedback can be configured to compensate for EVM effects during dynamic operation of the PA circuit. Operation of the bias circuit can be facilitated by, for example, supply power, reference current, etc. collectively depicted by a node 312.

In some embodiments, the PA circuit can be implemented on the die 100, and the bias circuit 174 can be implemented on another semiconductor die. In some embodiments, some or all of the bias circuit 174 can also be implemented on the same die as the PA circuit. Such a configuration is depicted as 302.

For the purpose of description, it will be understood that the die 100 can include, for example, silicon (Si), gallium arsenide (GaAs), and silicon germanium (SiGe). Other types of semiconductor die can also be utilized. It will also be understood that amplifying transistors and sensing transistors as described herein can include bipolar junction transistors (BJTs) such as heterojunction bipolar transistors (HBT). Other types of transistors can be utilized for the amplifying transistors and sensing transistors.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 13:
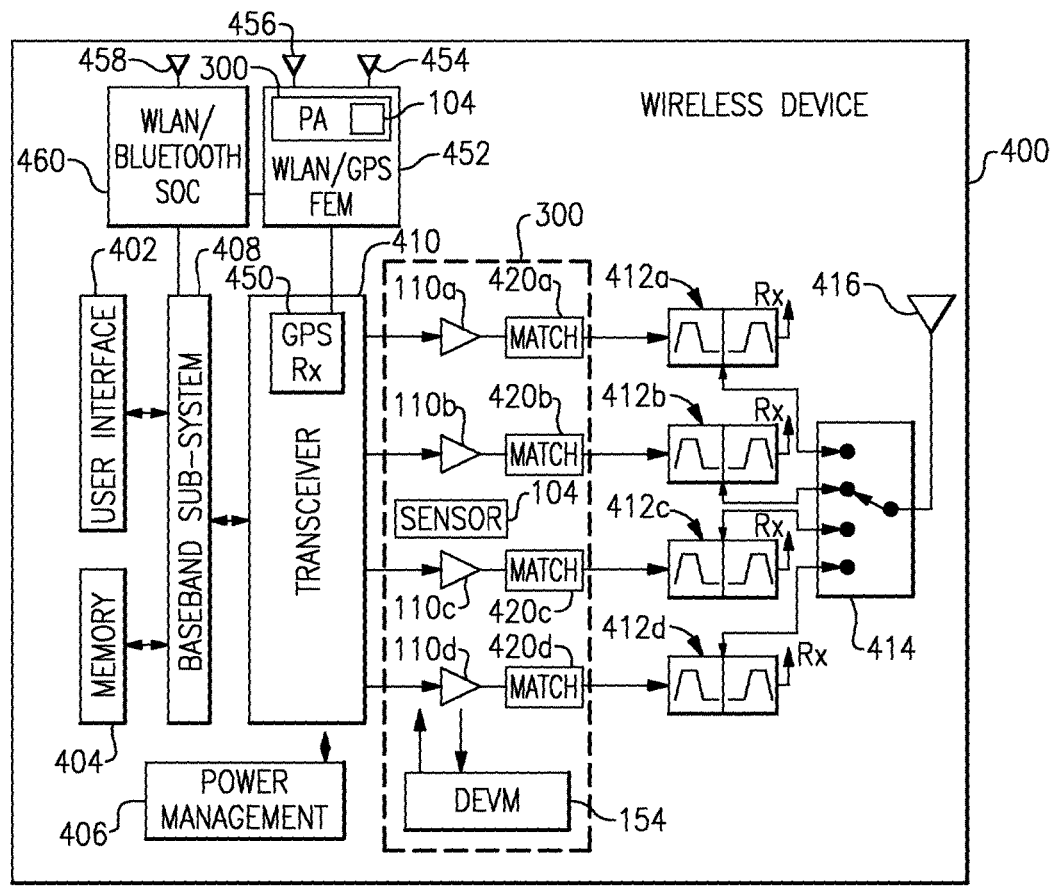
FIG. 13 depicts an example wireless device having one or more advantageous features described herein.

FIG. 13 schematically depicts an example wireless device 400 having one or more advantageous features described herein. In the context of various configurations described herein, a PA module(s) having functionality depicted as 300 can be included in the wireless device 400. For example, a front-end module (FEM) 452 for WLAN/GPS operations can include a PA module 300. Such a PA can be configured to amplify a WLAN signal for transmission through an antenna 456. Such a WLAN signal can be generated by a baseband sub-system 408 and routed to the FEM 452 through a WLAN/Bluetooth system-on-chip (SOC) 460. Transmission and reception of Bluetooth signals can be facilitated by an antenna 458. In the example shown, GPS functionality can be facilitated by the FEM 452 in communication with a GPS antenna 454 and a GPS receiver 450.

In another example, an RF PA module depicted as 300 can include one or more features as described herein. Such an RF PA module 300 can include one or more bands, and each band can include one or more amplification stages (collectively indicated as 110a, 110b, 110c or 110d). At least one of such amplification stages can be in communication with and benefit from a DEVM compensation circuit 154 as described herein. As also described herein, the DEVM compensation circuit 154 can be coupled to a sensor 104 such as a sensing transistor implemented at one or more amplification stages (e.g., power stage). Such a sensor can provide a signal representative of an operating condition of the amplification stage(s); and such a sensed signal can be utilized by the DEVM compensation circuit 154.

In the example wireless device 400, the RF PA module 300 having a plurality of PAs can provide an amplified RF signal to the switch 414 (via the duplexer 412), and the switch 414 can route the amplified RF signal to an antenna 416. The PA module 300 can receive an unamplified RF signal from a transceiver 410 that can be configured and operated in known manners.

The transceiver 410 can also be configured to process received signals. Such received signals can be routed to an LNA (not shown) from the antenna 416, through the duplexer 412.

The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such a power management component can also control operations of the baseband sub-system 408, as well as other components.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier (PA) comprising:
   a PA die;
   an amplification stage implemented on the PA die, the amplification stage including an array of amplification transistors configured to receive and amplify a radio-frequency (RF) signal;
   a sensor implemented on the PA die, the sensor positioned relative to the array of amplification transistors to allow sensing of an operating condition representative of at least some of the amplification transistors, the sensor substantially isolated from the RF signal and the sensor being operated identical to the array of amplification transistors; and
   a bias circuit in communication with the amplification stage and the sensor, the bias circuit configured to provide base bias signals having a common value to the amplification transistors and the sensor and configured to compensate for a dynamic error vector magnitude (DEVM) effect associated with operation of the amplification transistors.

2. The power amplifier of claim 1 wherein the sensor includes a sensing transistor configured to be similar to at least some of the amplification transistors.

3. The power amplifier of claim 2 wherein the operating condition includes an operating temperature of the at least some of the amplification transistors.

4. The power amplifier of claim 3 wherein the operating temperature is obtained from a collector current associated with the sensing transistor.

5. The power amplifier of claim 2 wherein the base bias voltages are provided to bases of the amplification transistors and the sensing transistor.

6. The power amplifier of claim 1 wherein the array of amplification transistors includes a plurality of amplification transistors arranged in a parallel configuration.

7. The power amplifier of claim 6 wherein the plurality of amplification transistors are grouped into a first group and a second group.

8. The power amplifier of claim 7 wherein the sensor is implemented between the first group of amplification transistors and the second group of amplification transistors.

9. The power amplifier of claim 1 wherein the sensor includes a bandgap reference device.

10. The PA of claim 1 wherein the sensor includes a proportional to absolute temperature (PTAT) device.

11. A method for fabricating a power amplifier (PA), the method comprising:
    providing or forming a semiconductor wafer;
    forming a plurality of amplification stages on the semiconductor wafer, each amplification stage including an array of amplification transistors configured to receive and amplify a radio-frequency (RF) signal;
    forming a plurality of sensors on the semiconductor wafer such that at least one sensor is positioned relative to each array of amplification transistors to allow sensing of an operating condition representative of the amplification transistors, the sensor substantially isolated from the radio-frequency signal and the sensor being operated identical to the array of amplification transistors; and coupling a bias circuit to the plurality of amplification stages and the plurality of sensors, the bias circuit configured to provide base bias signals having a common value to the plurality of amplification stages and the plurality of sensors and configured to compensate for a dynamic error vector magnitude (DEVM) effect associated with operation of the amplification transistors.

12. The method of claim 11 further comprising singulating the semiconductor wafer to yield a plurality of power amplifier die.

13. A radio-frequency (RF) module comprising:
a packaging substrate configured to receive a plurality of components; and
a power amplifier (PA) die mounted on the packaging substrate, the power amplifier die including a power amplifier circuit with an amplification stage including an array of amplification transistors configured to receive and amplify a radio-frequency (RF) signal, the power amplifier die further including a sensor positioned relative to the array of amplification transistors to allow sensing of an operating condition representative of at least some of the amplification transistors, the sensor substantially isolated from the radio-frequency signal and the sensor being operated identical to the array of amplification transistors, the amplification stage and the sensor coupled to a bias circuit configured to provide base bias signals having a common value to the amplification stage and the sensor and configured to compensate for a dynamic error vector magnitude (DEVM) effect associated with operation of the amplification transistors.

14. The radio-frequency module of claim 13 wherein the power amplifier circuit is configured to amplify an radio-frequency signal for a wireless local area network (WLAN).

15. The radio-frequency module of claim 13 wherein the sensor is configured to track an operating temperature of the amplification stage.

16. The radio-frequency module of claim 15 further comprising the bias circuit.

17. The radio-frequency module of claim 16 wherein the bias circuit is further configured to compensate at least some of the bias signals based on a sensed signal representative of the operating temperature.

18. The radio-frequency module of claim 17 wherein the compensation of the bias signals is configured to compensate for the dynamic error vector magnitude effect.

* * * * *